(12) United States Patent
Huang et al.

(10) Patent No.: US 10,312,089 B1
(45) Date of Patent: Jun. 4, 2019

(54) METHODS FOR CONTROLLING AN END-TO-END DISTANCE IN SEMICONDUCTOR DEVICE

(71) Applicant: Taiwan Semiconductor Manufacturing Co., Ltd., Hsinchu (TW)

(72) Inventors: Yu-Lien Huang, Jhubei (TW); Tsai-Chun Li, Hsinchu (TW); Huan-Just Lin, Hsinchu (TW); Huang-Ming Chen, Hsinchu (TW); Yang-Cheng Wu, Hsinchu (TW); Cheng-Hua Yang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/923,072

(22) Filed: Mar. 16, 2018

Related U.S. Application Data

(60) Provisional application No. 62/591,890, filed on Nov. 29, 2017.

(51) Int. Cl.
| | |
|---|---|
| *H01L 21/033* | (2006.01) |
| *H01L 21/027* | (2006.01) |
| *H01L 21/311* | (2006.01) |
| *H01L 21/768* | (2006.01) |
| *H01L 21/8234* | (2006.01) |
| *H01J 37/32* | (2006.01) |
| *G03F 7/20* | (2006.01) |

(Continued)

(52) U.S. Cl.
CPC ........ *H01L 21/0338* (2013.01); *G03F 7/2004* (2013.01); *G03F 7/36* (2013.01); *H01J 37/32422* (2013.01); *H01L 21/0274* (2013.01); *H01L 21/0335* (2013.01); *H01L 21/0337* (2013.01); *H01L 21/31116* (2013.01); *H01L 21/31144* (2013.01); *H01L 21/67069* (2013.01); *H01L 21/76805* (2013.01); *H01L 21/76895* (2013.01); *H01L 21/823431* (2013.01); *H01L 21/823475* (2013.01); *H01J 37/321* (2013.01); *H01J 37/32715* (2013.01); *H01J 2237/20214* (2013.01); *H01J 2237/20228* (2013.01); *H01J 2237/334* (2013.01)

(58) Field of Classification Search
CPC ............ H01L 21/0338; H01L 21/0274; H01L 21/0335; H01L 21/0337; H01L 21/31116; H01L 21/31144; H01L 21/76805; H01L 21/76895; H01L 21/823431; H01L 21/823475

See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Kyoung Lee
(74) *Attorney, Agent, or Firm* — Slater Matsil, LLP

(57) ABSTRACT

Embodiments of the present disclosure may be used for patterning a layer in a 5 nm node or beyond fabrication to achieve an end-to-end distance below 35 nm. Compared to the state of the art technology, embodiments of the present disclosure reduce cycle time and cost of production from three lithographic processes and four etching processes to one lithographic process and three etch processes.

20 Claims, 17 Drawing Sheets

(51) Int. Cl.
 *G03F 7/36* (2006.01)
 *H01L 21/67* (2006.01)

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2013/0193519 A1 | 8/2013 | Wang |
| 2016/0148935 A1 | 5/2016 | Chen et al. |
| 2016/0351669 A1 | 12/2016 | Shiao et al. |
| 2016/0379816 A1* | 12/2016 | Ruffell ............... H01L 21/0273 438/712 |
| 2017/0139318 A1 | 5/2017 | Wallace et al. |

\* cited by examiner

US 10,312,089 B1

METHODS FOR CONTROLLING AN END-TO-END DISTANCE IN SEMICONDUCTOR DEVICE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

As the semiconductor industry has progressed into nanometer technology process nodes, such as 5 nm nodes, in pursuit of higher device density, higher performance, and lower costs. The shrinking dimension of the semiconductor devices presents challenges in semiconductor processing steps. There is a need to improve efficiency and reduce cost for various semiconductor processing steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
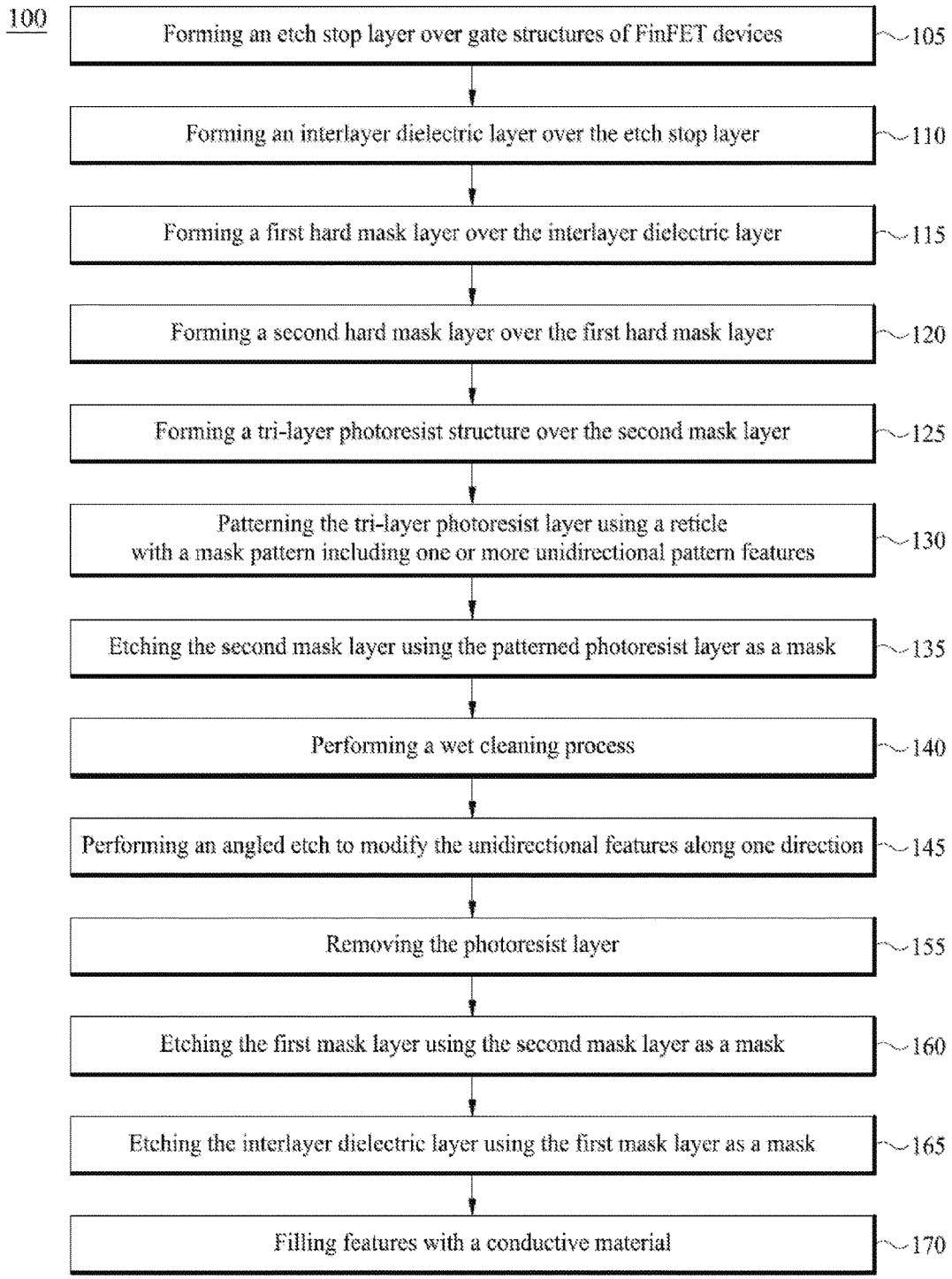
FIG. 1 is a flow chart of a method for manufacturing a semiconductor device according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relates to methods for forming a pattern with reduced an end-to-end distance. During semiconductor processing, an end-to-end distance or an end-to-end critical dimension may refer to the shortest distance separating two neighboring features in the pattern. For example, when a pattern includes two linear features positioned next two each other along the same axis, for example, the longitudinal axis, a distance between the two nearest end points of the two features in the axial axis is referred to the end-to-end distance between the two features. The features may be openings/holes or islands in the pattern.

As the dimension of devices shrink, the end-to-end distance in pattern features also shrinks. For the node 5 nm process, the end-to-end distance may be below 30 nm. It is challenging to achieve below 30 nm end-to-end distance using a single photolithographic process. Patterns with an end-to-end distance below 30 nm may be achieved through three lithographic processes and four etch processes in MD hard mask process.

For example, a first photolithographic process is used to form a first pattern with first features in a first photoresist structure. The first features may include lines along the x-direction. The width of the lines or the dimension of the lines along the y-direction represents a target end-to-end distance in the final pattern. The first photolithographic process may be an extreme ultraviolet (EUV) lithographic process. The first pattern is transferred to a first hard mask layer by a first etch process using the first photoresist structure as a mask. After the first photoresist structure from the first lithographic process is removed, a second photoresist structure is coated for a second photolithographic process.

The second photolithographic process is performed to pattern a second pattern with second features in a second photoresist structure. The second features may include lines along the y-direction. The width of the lines or the dimension of the lines along the x-direction represents a target width of features in the final pattern. The second photolithographic process may be an immersion lithographic process. The second pattern is transferred to a second hard mask layer underneath the first hard mask layer by a second etch process using the second photoresist structure and the first hard mask layer as a mask. After the second photoresist structure from the second lithographic process is removed, a third photoresist structure is coated for a third photolithographic process.

The third photolithographic process is performed to pattern a third pattern with third features in the third photoresist structure. The third features may include lines along the y-direction. The second features and the third features may be identical but aligned at half a pitch apart to form lines along the y-direction. The width of the lines or the dimension of the lines along the x-direction represents a target width of features in the final pattern. The third photolithographic process may be an immersion lithographic process. The third pattern is transferred to the second hard mask by a third etch process using the third photoresist structure and the first hard mask layer as a mask.

After the third photoresist structure from the third lithographic process is removed, the final pattern is formed in a third hard mask layer by a fourth etch process using the first and second hard masks as a mask. The final pattern on the third mask reflects the overlay of the three patterns. Thus, in the existing technology, it takes three lithographic processes and four etch processes to achieve the end-to-end distance below 30 nm.

Embodiments of the present disclosure provides a method for forming a pattern having an end-to-end distance below 30 nm using one photolithographic process and one pattern.

FIG. 1 is a flow chart of a method 100 for manufacturing a semiconductor device according to one embodiment of the present disclosure. The method 100 can be used to pattern a layer in a semiconductor substrate with unidirectional features. The method 100 uses one photolithographic operation to form unidirectional features with an end-to-end critical dimension of less than about 30 nm. The method 100 can be used to pattern various layers in manufacturing semiconductor devices. For example, the method 100 can be used to pattern an interlayer dielectric layer, to form metal gate structures, to pattern active regions, and to pattern a polysilicon layer in a semiconductor device, such as a FinFET device. FIGS. 2A-2K are schematic cross sectional views of various stages of forming a semiconductor device 200 according to the method 100.

Figure 2A:
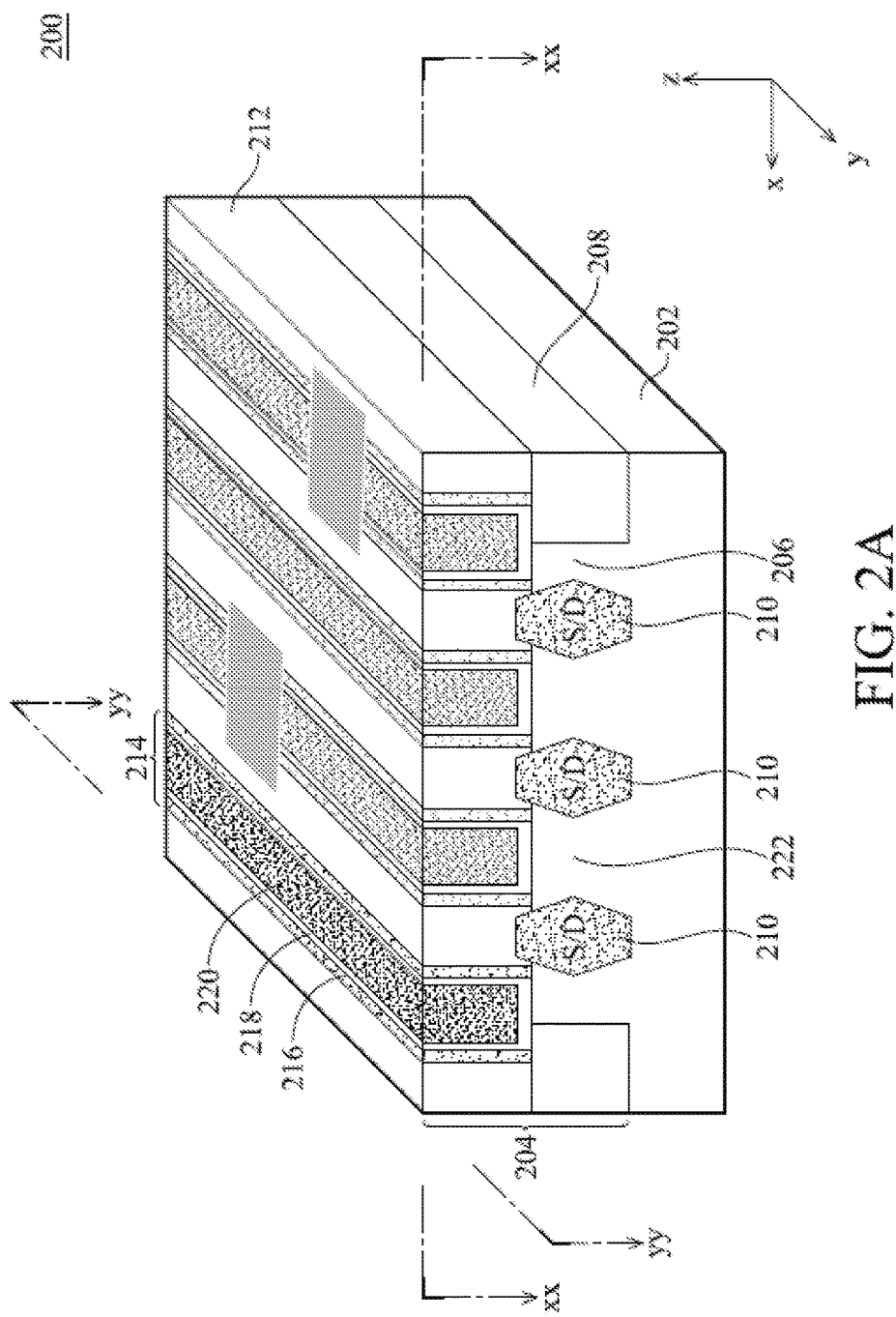
FIGS. 2A-2K are schematic sectional views of various stages of forming a semiconductor device according to one embodiment of the present disclosure.

FIG. 2A is a schematic perspective cross sectional view of the semiconductor device 200. In one embodiment, the semiconductor device 200 includes one or more FinFET device structures 204 formed on a substrate 202. The substrate 202 may be made of silicon or other semiconductor materials. Alternatively or additionally, the substrate 202 may include other elementary semiconductor materials such as germanium. In some embodiments, the substrate 202 is made of a compound semiconductor such as silicon carbide, gallium arsenic, indium arsenide, or indium phosphide. In some embodiments, the substrate 202 is made of an alloy semiconductor such as silicon germanium, silicon germanium carbide, gallium arsenic phosphide, or gallium indium phosphide. In some embodiments, the substrate 202 includes an epitaxial layer. For example, the substrate 202 has an epitaxial layer overlying a bulk semiconductor.

The FinFET device structure 204 includes one or more fin structures 206 (e.g., Si fins) that extend from the substrate 202. The fin structures 206 may optionally include germanium. The fin structures 206 may be formed by using suitable processes such as photolithographic and etching processes. In some embodiments, the fin structures 206 are etched from the substrate 202 using dry etch or plasma processes.

An isolation structure 208, such as a shallow trench isolation (STI) structure, is formed to surround the fin structures 206. In some embodiments, a lower portion of the fin structures 206 is surrounded by the isolation structure 208, and an upper portion of the fin structures 206 protrudes from the isolation structure 208. In other words, a portion of the fin structures 206 is embedded in the isolation structure 208. The isolation structure 208 prevents electrical interference or crosstalk.

The FinFET device structure 204 further includes gate stack structures 214 surrounded by an interlayer dielectric layer 212. The interlayer dielectric layer 212 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The interlayer dielectric layer 212 may be formed by chemical vapor deposition (CVD), physical vapor deposition, (PVD), atomic layer deposition (ALD), spin-on coating, Flow-able CVD, or other applicable processes.

The gate stack structure 214 includes spacers 216, gate stack layers 218, and an electrode 220. The gate structure 214 is formed over a central portion of the fin structures 206. In some embodiments, multiple gate stack structures 214 are formed over the fin structures 206. The gate stack layers 218 may include multiple layers, such as high-k dielectric layers, capping layers, high-k metal layers, interface layers, and/or other suitable features.

The gate stack layers 218 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 220 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. The gate electrode 220 may be formed in a gate last process (or gate replacement process).

FIG. 2A illustrates gate cut regions 213 disposed between and separating longitudinally aligned gate stack structures 214. The gate stack structures 214 can be formed separated by gate cut regions 213 by any method. For example, in the context of a replacement gate process, dummy gate structures, which are to be removed and replaced by the gate stack structures 214, can be formed and patterned being separated by the gate cut regions 213. In such a case, spacers 216 may be formed along the gate stack structures 214 at the gate cut regions 213. In other examples, the dummy gate structures may be cut after the interlayer dielectric layer 212 is formed, such as by etching the dummy gate structures and filling the etched recesses with a dielectric material to form the gate cut regions 213. In further examples, the gate stack structures 214 may be cut after forming the interlayer dielectric layer 212 and the gate stack structures 214, such as by etching the gate stack structures 214 and filling the etched recesses with a dielectric material to form the gate cut regions 213.

The fin structures 206 includes a channel region 222 surrounded or wrapped by the gate structures 214. The fin structures 206 may be doped to provide a suitable channel for an n-type FinFET (NMOS device) or a p-type FinFET (PMOS device). The fin structures 206 may be doped using a suitable process, such as an ion implantation process, diffusion process, annealing process, other applicable processes, or combinations thereof. The fin structures 206 include source/drain regions 210 and channel regions 222 between the source/drain regions 210. The FinFET device structure 204 may be a device included in a microprocessor, memory cell (e.g., Static Random-Access Memory (SRAM), and/or other integrated circuits.

The FinFET device structure 204 includes multiple fin structures 206 and multiple gate structures 214. The gate structures 214 traverse over the fin structures 206. The fin structures 206 may be substantially parallel to each other. The gate structures 214 may also be parallel to each other and substantially perpendicular to the fin structures 206. As shown in FIG. 2A, the fin structures 206 are along the x-direction and the gate structures 214 are along the y-direction.

FIG. 2A is an example structure on which patterning with reduced end-to-end distances, such as described with respect to FIG. 1, may be performed.

FIGS. 2B-2K are partial cross sectional views of the semiconductor device 200. Each of the FIGS. 2B-2K includes a 1D (X-cut) view that is a cross sectional view of the semiconductor device 200 along a XX-XX plane that is parallel to the x-z plane, and a 2D (Y-cut) view that is a cross sectional view of the semiconductor device 200 along a YY-YY plane that is parallel to the y-z plane. As shown in FIG. 2A, the x-y-z coordinates are selected where the x-y plane is parallel to a top surface of the substrate 200, and the z-axis is perpendicular to the top surface of the substrate 200.

In operation 105 of the method 100, an etch stop layer 224 is formed over the gate structures 214 and the interlayer dielectric layer 212. The etch stop layer 224 may be a single layer or multiple layers. The etch stop layer 224 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the etch stop layer 224 has a bi-layer structure which includes a silicon oxide (SiOx) layer formed on a SiC layer, and silicon oxide layer is formed from tetraethyl orthosilicate (TEOS). The SiC layer is used as a glue layer to improve adhesion between the underlying layer and the silicon oxide layer.

In one embodiment, the etch stop layer 224 has a thickness of between about 2 nm and 10 nm, for example about 5 nm. The etch stop layer 224 includes a silicon nitride ($Si_xN_y$) formed by a plasma enhanced chemical vapor deposition (PECVD) process.

Figure 2B:
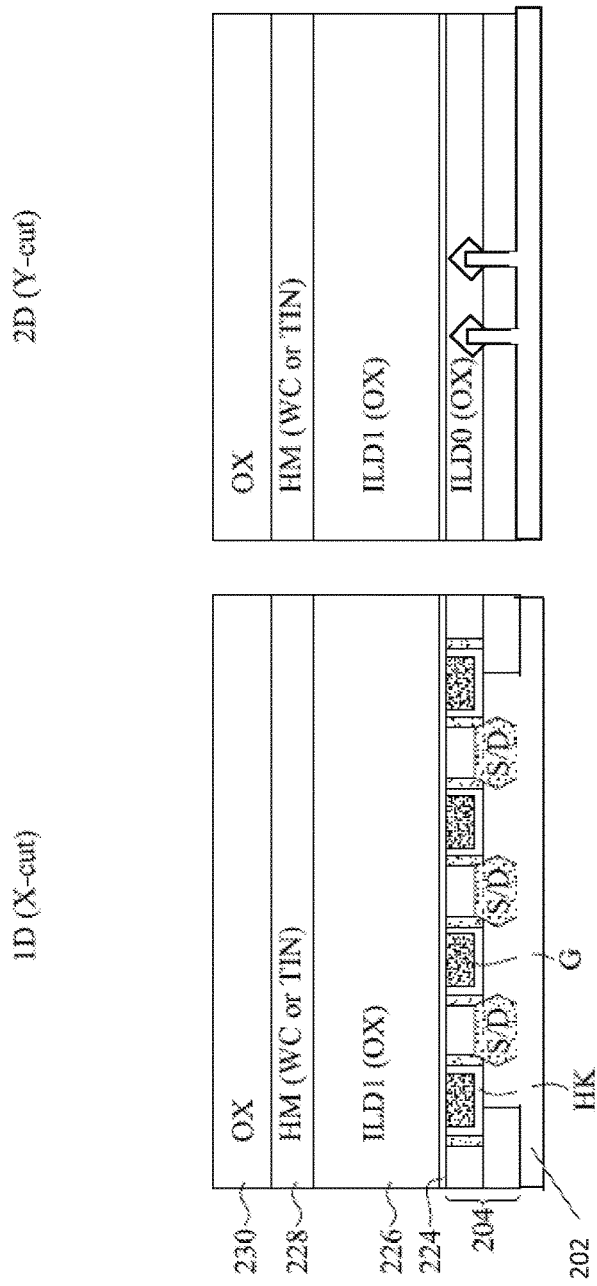

In operation 110 of the method 100, an interlayer dielectric layer 226 is formed over the etch stop layer 224 as shown in FIG. 2B. The interlayer dielectric layer 226 is configured to electrically isolate contact structures connecting the FinFET device structure 204 from each other.

In some embodiments, the interlayer dielectric layer 226 is formed from physically densifying and/or chemically converting flowable dielectric material(s) into dielectric materials, such as silicon oxide and silicon nitride. In some embodiment, the interlayer dielectric layer 226 includes flowable dielectric materials formed in a flowable CVD (FCVD) process. In some embodiments, flowable dielectric materials may primarily include silicon nitride, silicon oxynitride, silicon carbide, or silicon oxycarbide. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA).

In one embodiment, the interlayer dielectric layer 226 is formed from annealing and high temperature (HT) doping flowable dielectric materials into silicon oxide. In some embodiments, annealing and/or HT doping of deposited flowable dielectric materials helps to remove undesired element(s) to densify the deposited flowable dielectric material. Materials used for doping these flowable dielectric materials may include silicon, germanium, oxygen, nitrogen, or any combination thereof, or any element(s) that does not alter and/or degrade the dielectric properties of the interlayer dielectric layer 226. The HT doping process to form the interlayer dielectric layer 226 improves structural density of the dielectric material of the interlayer dielectric layer 226. For example, such improvement in structural density substantially reduces the wet etch rate (WER) of the interlayer dielectric layer 226 by about 30% to about 50% compared to the interlayer dielectric layers used formed without the HT doping process.

In one embodiment, the interlayer dielectric layer 226 includes silicon oxide formed from FCVD. The interlayer dielectric layer 226 may have a thickness between about 30 nm and 100 nm, for example, about 65 nm.

In operation 115 of the method 100, a first hard mask layer 228 is formed over the interlayer dielectric layer 226, as shown in FIG. 2B. The first hard mask layer 228 is configured to provide a high etching selectivity relative to the interlayer dielectric layer 226 during a dry etch process. In some embodiments, the first hard mask layer 228 is made of a metal material, such as tungsten carbide (WC), titanium nitride (TiN), tantalum nitride (TaN), or tungsten nitride (WN). In one embodiment, the first hard mask layer 228 has a thickness between about 10 nm and 50 nm, for example, about 20 nm.

In operation 120 of the method 100, a second hard mask layer 230 is formed over the first hard mask layer 228 as shown in FIG. 2B. The second hard mask layer 230 is configured to provide a high etching selectivity relative to the first hard mask layer 228 during a dry etch process. The second hard mask layer 230 may include a silicon oxide layer, or other suitable material. In one embodiment, the second hard mask layer 230 is a silicon oxide layer formed by PECVD. In one embodiment, the second hard mask layer 230 has a thickness between about 20 nm and 80 nm, for example, about 40 nm.

Figure 2C:
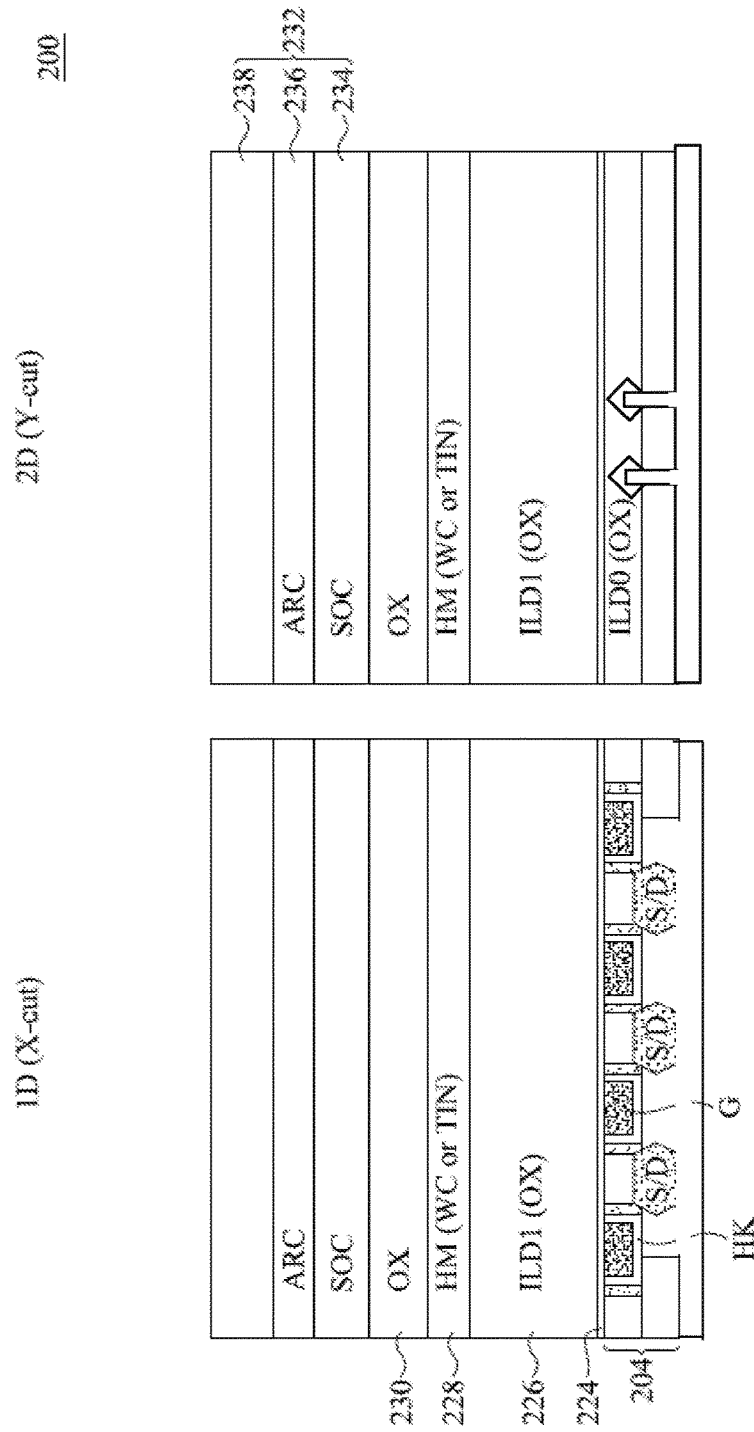

In operation 125 of the method 100, a tri-layer photoresist structure 232 is formed on the second hard mask layer 230 as shown in FIG. 2C. The tri-layer photoresist structure 232 includes a bottom layer 234, a middle layer 236, and a top layer 238. In one embodiment, the tri-layer photoresist 232 may be selected to be suitable for an extreme ultraviolet (EUV) photolithography.

The bottom layer 234 contains a material that is patternable and/or has a composition tuned to provide anti-reflection properties. In one embodiment, the bottom layer 234 is a bottom anti-reflective coating (BARC) layer configured to reduce reflection during the photolithography process. In one embodiment, the bottom layer 234 includes monomers or polymers that are not cross-linked, for example a carbon backbone polymer. In other embodiments, the bottom layer 234 is made of nitrogen-free material, such as silicon rich oxide, or silicon oxycarbide (SiOC). The bottom layer 234 may be formed by a spin coating process. In other embodiments, the underlayer may be formed by another suitable deposition process. In one embodiment, the bottom layer 234 includes spin-on-carbon (SOC). The bottom layer 234 may have a thickness between about 60 nm and 300 nm, for example, about 200 nm.

The middle layer 236 may have a composition that provides an anti-reflective properties and/or hard mask properties for the lithography process. In one embodiment, the middle layer 236 includes a silicon containing layer (e.g., silicon hard mask material). The middle layer 236 may include a silicon-containing inorganic polymer. In other embodiment, the middle layer 236 includes a siloxane polymer (e.g., a polymer having a backbone of O—Si—O—Si—etc.). The silicon ratio of the middle layer 236 may be selected to control the etch rate. In other embodiments the middle layer 236 may include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. In one embodiment, the middle layer 236 may have a thickness between about 15 nm and 50 nm, for example, about 30 nm.

The top layer 238 may be a positive photoresist layer or a negative photoresist layer. In some embodiments, the top layer 238 is made of Poly (methyl methacrylate) (PMMA), Poly (methyl glutarimide) (PMGI), Phenol formaldehyde resin (DNQ/Novolac) or SU-8. In one embodiment, the top layer 238 may have a thickness between about 30 nm and 85 nm, for example, about 65 nm.

In operation 130 of the method 100, the top layer 238 is patterned using a photolithography process. The top layer 238 may be formed using an EUV lithography process, which uses extreme ultraviolet (EUV) radiation or soft x-ray, i.e. radiation with wavelength shorter than 130 nm, has become one of the lithography methods for forming smaller semiconductor devices.

Figure 2D:
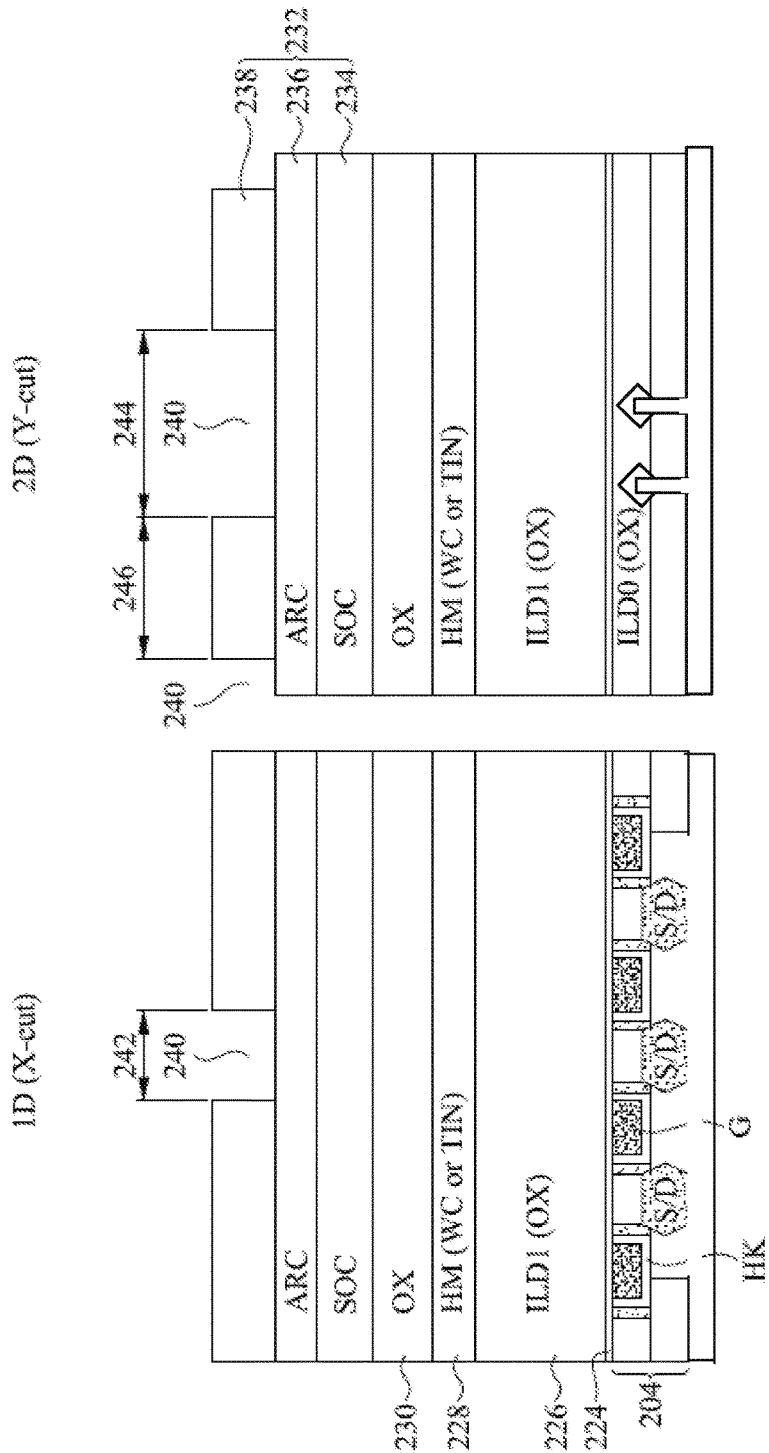

After the photolithography process, features 240 are formed in the top layer 238 as shown in FIG. 2D. In one embodiment, each feature 240 may be an opening having a width 242 along the x-direction and a length 244 along the y-direction. The width 242 may be between about 10 nm and 15 nm. In one embodiment, the length 244 may be between about 20 nm to 100 nm. The features 240 may be aligned along the y-direction with an end-to-end distance 246 between the neighboring features 240. In other words, the features 240 are uni-directionally arranged such that a longitudinal axis of each feature 240 is parallel to the y-axis. In one embodiment, the end-to-end distance 246 may be less than about 65 nm. For example, the end-to-end distance 246 may be less than 55 nm. In one embodiment, the end-to-end distance 246 is between about 40 nm to about 50 nm.

In one embodiment, the length 244 of the features 240 is shorter than a target length of an opening to be formed in the interlayer dielectric layer 226. In other words, the end-to-end distance 246 is longer than a target end-to-end distance to be achieved in the interlayer dielectric layer 226. In one embodiment, the length 244 may be between about 20 nm and 30 nm shorter than a target length of features to be formed in the interlayer dielectric layer 226.

Figure 3A:
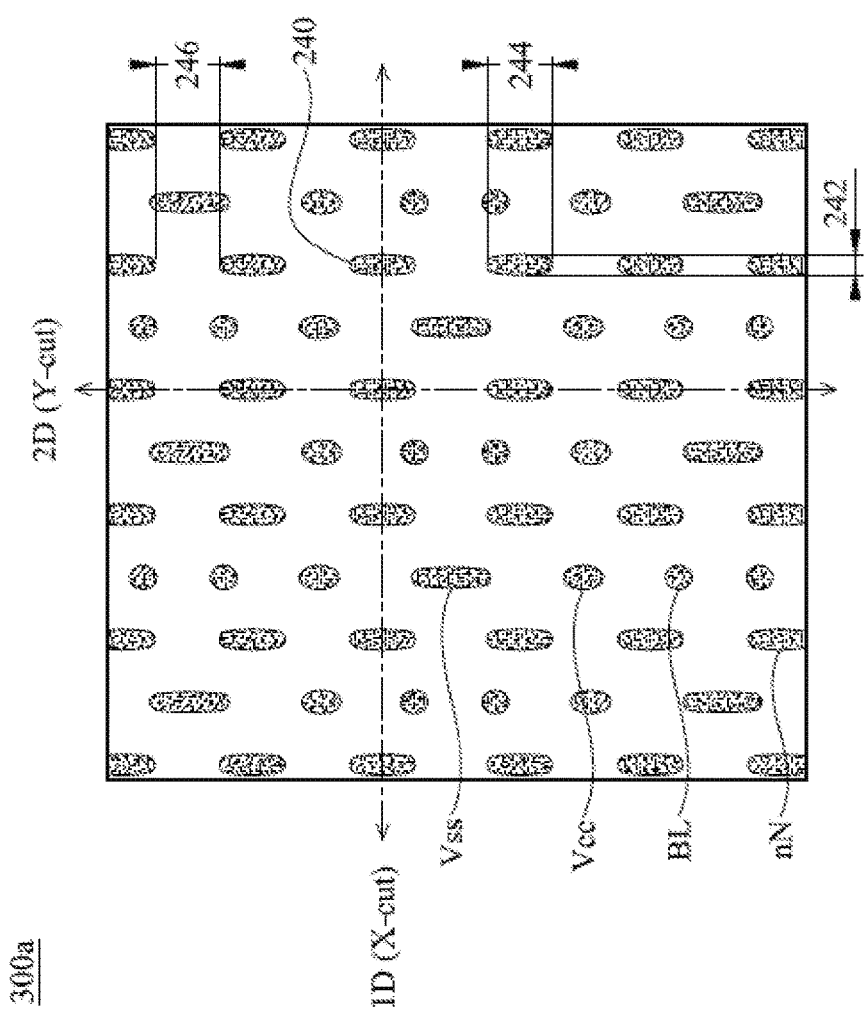
FIG. 3A is a schematic plan view of a reticle having a pattern with unidirectional features according to one embodiment of the present disclosure.

FIG. 3A is a schematic plan view of a pattern 300a used to pattern the top layer 238. The pattern 300a reflects a pattern in a reticle used to pattern the top layer 238. The pattern 300a includes the plurality of unidirectional features 240. Particularly, the plurality of features 240 are arranged in multiple lines along the y-direction and have substantially the same widths 242 along the x-direction. The lengths 244 of the plurality of features 240 along the y-direction may be similar or different depending on the design of the integrated circuit.

In the exemplary design of FIG. 3A, features 240 includes features 240Vss, 240Vcc, 240BL, 240nN which are intended to provide openings for electrically contacts to source/drain regions, gate electrode, and interconnects for FinFET devices. The features 240Vss, 240Vcc, 240BL, 240nN have substantially similar width along the x-direction and various lengths along the longitudinal direction or the y-direction. For example, the features 240Vss, 240Vcc, 240BL are linearly arranged along the same line in the y-direction. The features 240Vss, 240Vcc, 240BL may have a length of about 80 nm, 35 nm, and 15 nm respectively. End-to-end distances between neighboring features 240Vss, 240Vcc, 240BL may be about 55 nm. A plurality of features 240nN are linearly arranged along the same line in the y-direction. The features 240nN may have a length of about 55 nm. End-to-end distances between neighboring features 240nN may be about 55 nm.

Referring back to FIG. 2D, after the top layer 238 is patterned, the middle layer 236 is patterned using the patterned top layer 238 as a mask. As a result, the pattern of the top layer 238 is transferred to the middle layer 236 forming a patterned middle layer 236. After the middle layer 236 is patterned, the bottom layer 234 is patterned using the patterned middle layer 236 as a mask as shown. The middle layer 236 and the bottom layer 234 may be patterned using a plasma process.

Figure 2E:
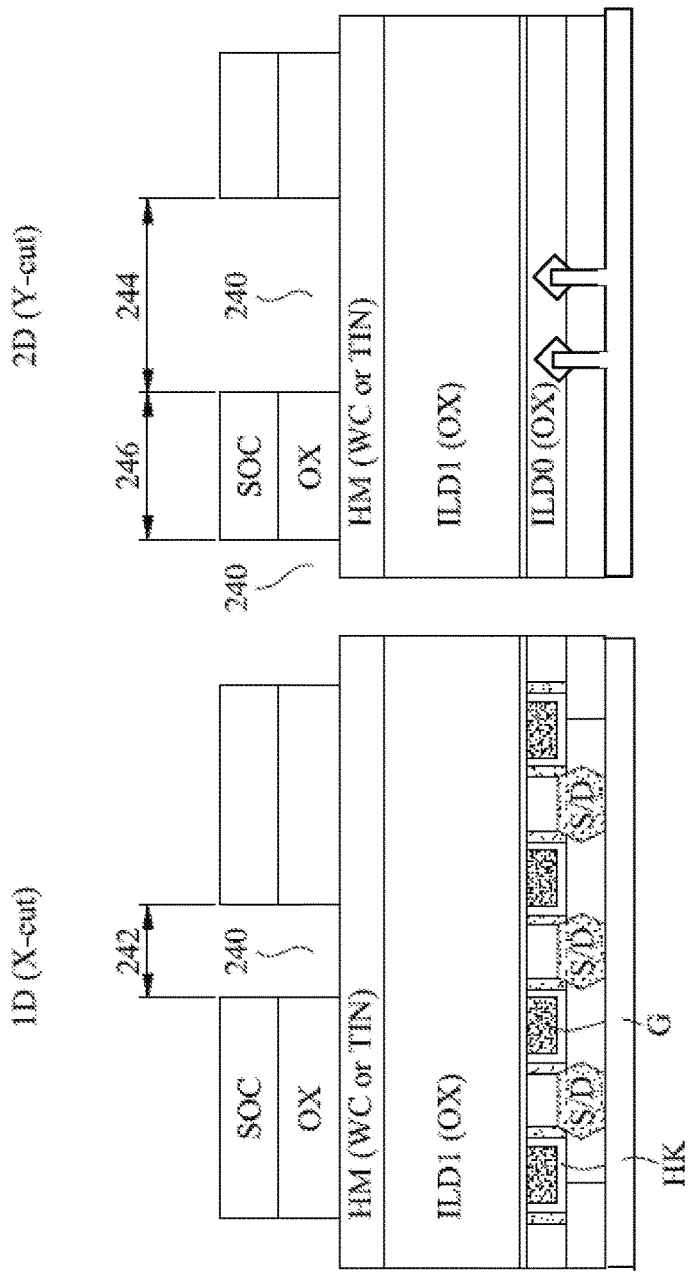

In operation 135 of the method 100, the second hard mask layer 230 is patterned using the patterned photoresist structure 232 as a mask, as shown in FIG. 2E. A dry etch process may be used in operation 135 to pattern the second mask layer 230. During operation, the features 240 are transferred from the patterned photoresist structure 232 to the second mask layer 230.

In one embodiment, the second mask layer 230 is patterned using an etch gas comprising fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

In operation 140 of the method 100, a dry etching process may be performed to remove the top layer 238 and the middle layer 236. As shown in FIG. 2E, only the bottom layer 234 of the tri-layer photoresist structure 232 is left after the dry etching process in operation 140.

Figure 2F:
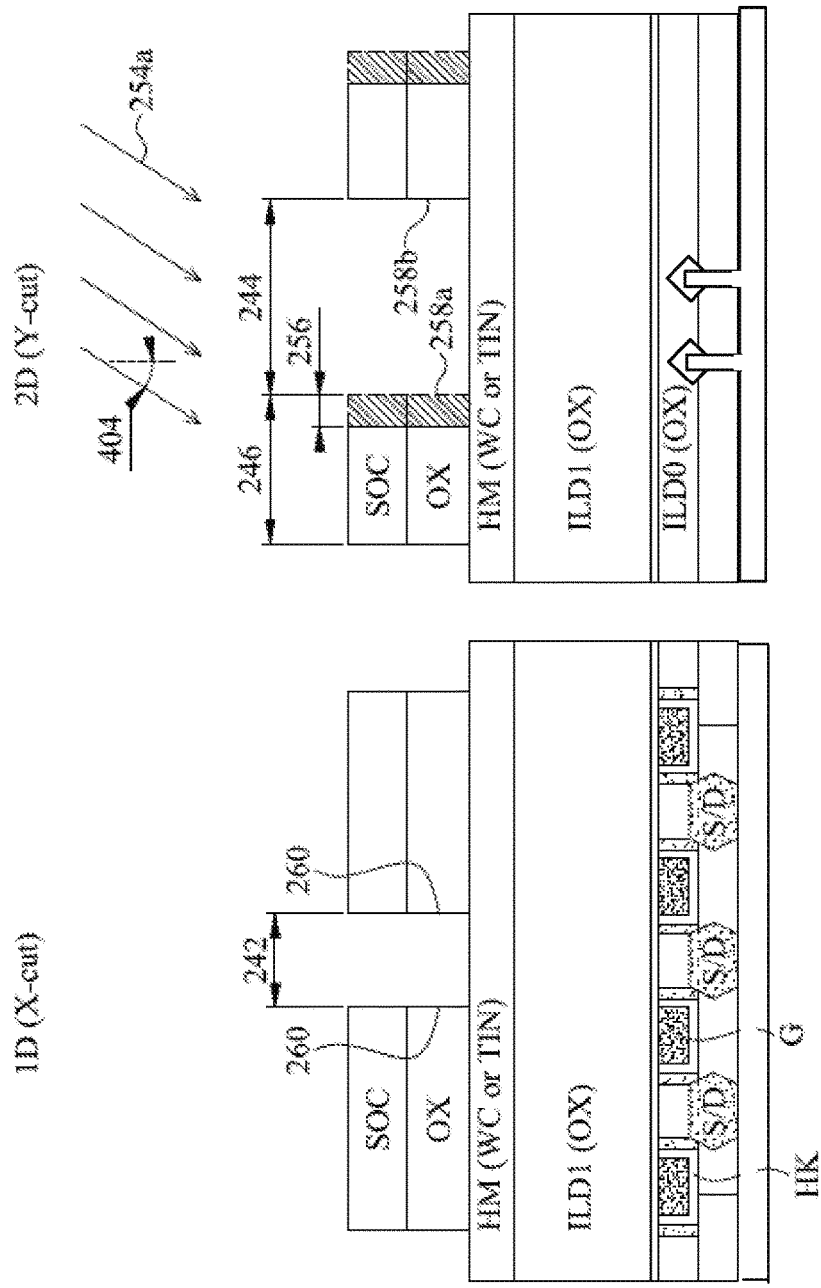
Figure 2G:
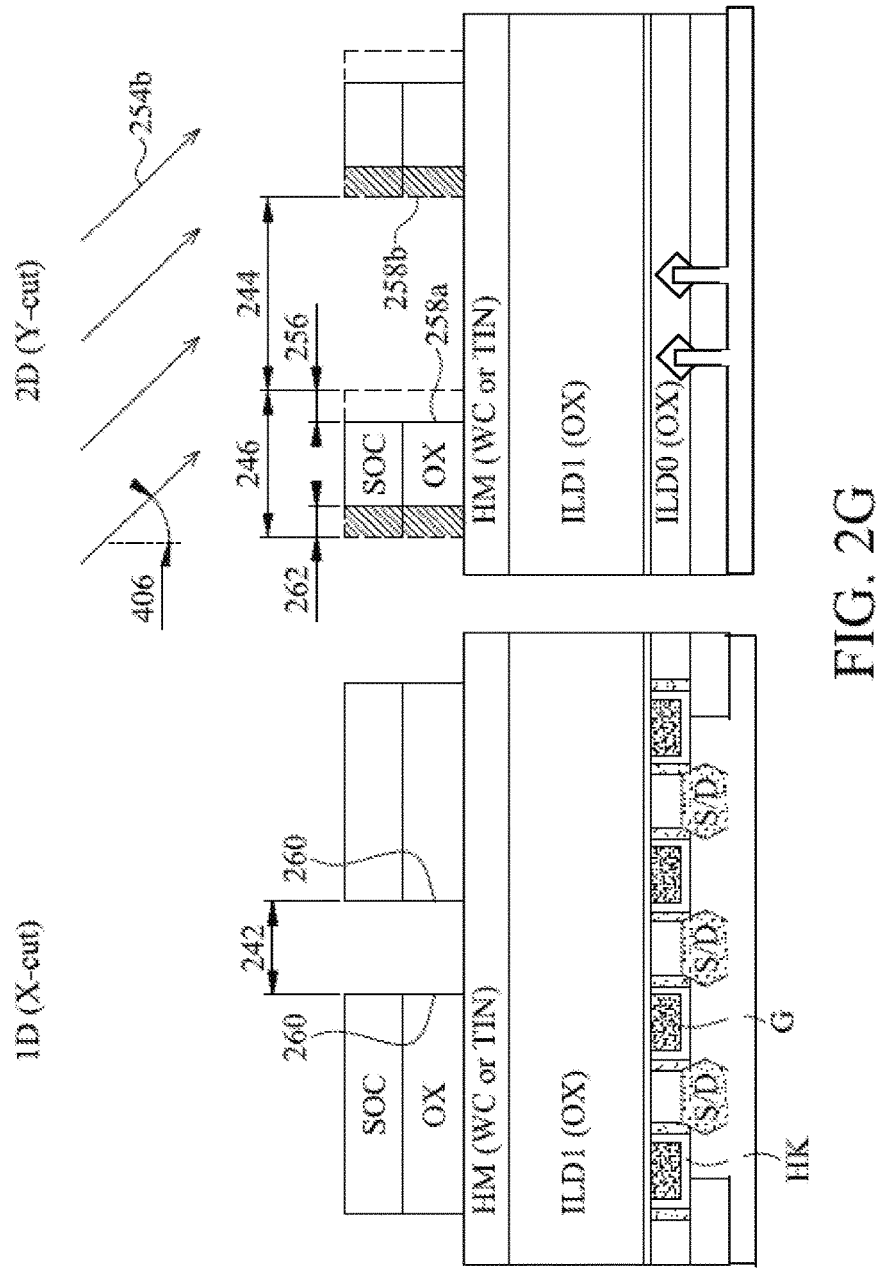

In operation 145 of the method 100, an angled etch process is performed to modify the patterned second hard mask layer 230 along one direction as shown in FIGS. 2F and 2G. Ion beams 254a and/or ion beam 254b are directed to the substrate 200 at an angle relative to the z-axis to modify sidewalls 258a, 258b of the features 240 in the y-direction without affecting sidewalls 260 of the features 240.

Figure 4:
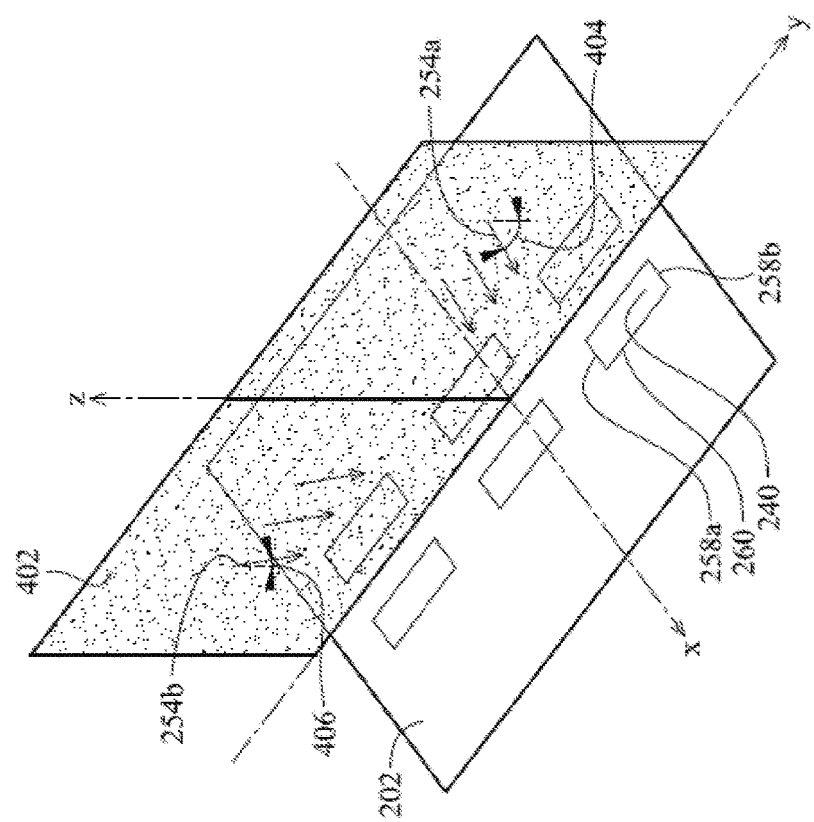
FIG. 4 is a schematic plot of an angled etch process according to one embodiment of the present disclosure.

FIG. 4 is a schematic plot of an angled etch process used in the operation 145. The substrate 202 having features 240 is positioned in the x-y plane. The substrate 202 may be rotated about the z-axis so that sidewalls 260 are along the y-direction or the longitudinal axis of the features 240 is parallel to the y-axis. Ion beams 254a, 254b are directed towards substrate 202 in a plane substantially parallel to the y-z plane so that the ion beans 254a, 254b are parallel to the sidewalls 260 of the features 24o. Ion beams 254a may have an angle 404 relative to the z-axis in the y-z plane. Ion beams 254a may have an angle 406 relative to the z-axis. In one embodiment, ion beams 254a, 254b may be a ribbon of ion beams in a plane 402 scanning across the substrate along the x-direction. In other embodiments, ion beams 254a, 254b may be bulk ion beams directed to the entire surface of the substrate 202 simultaneously.

The angles 404, 406 may be selected according to an aspect ratio along the y-direction (a depth over length 244) of the features 240 to achieve a target etch rate along the y-direction. In one embodiment, the angles 404, 406 may be between 10 degrees and 30 degrees when the maximum aspect ratio along the y-direction of the features 240 (depth of the feature 240 over the minimum length 244) is between about 1.0 to 10, for example about 5.0. In one embodiment, the angles 404, 406 may be about 20 degrees when the maximum aspect ratio along the y-direction of the features 240 (depth of the feature 240 over the minimum length 244) is between about 1.0 to 10, for example about 5.0.

The angles 404, 406 may be selected to adjust an etch rate along the y-direction. For example, a larger angel 404, 406 corresponds to a faster etch rate along the bottom of hard mask 230 y-direction. In other embodiments, etching time and etch rate may be selected to achieve a desired increase in length of the features 240. In one embodiment, one or both of angles 404, 406 can be spread in a range of angles. In one embodiment, one or both of angles 404, 406 are spread in a range of about 10°. In another embodiment, one or both of angles 404, 406 are spread in a range of about 5°.

In operation 145, the ion beams 254a are directed to the substrate 202 at the angle 404 so that the ion beams 254a impinge the second mask layer 230 on the sidewall 258a of the feature 240 as shown in FIG. 2F. On the other hand, the ion beams 254a do not directly impinge the sidewalls 260 of the features 240. As a result, the features 240 obtain a length increase 256 along the y-direction while the width 242 of the features 240 remains unchanged. Similarly, the ion beams 254b are directed to the substrate 202 at the angle 406 so that the ion beams 254b impinge the second mask layer 230 on the sidewall 258b of the features 240 as shown in FIG. 2G. On the other hand, the ion beams 254b do not directly impinge the sidewalls 260 of the feature 240. As a result, the features 240 obtain a length increase 262 along the y-direction while the width 242 of the features 240 remains unchanged.

Depending on the recipe used in the operation 145, one or both ion beams 254a, 254b may be applied. Ion beams 254a, 254b may be applied at sequentially or simultaneously depending on the apparatus used in operation 145.

In one embodiment, the ion beam 254a, 254b may be generated from a plasma of an etch gas. The etch gas may include fluorine-containing gas, nitrogen ($N_2$), oxygen ($O_2$) or an inert gas, such as argon (Ar), or combinations thereof. The fluorine-containing gas includes tetrafluoromethane ($CF_4$), nitrogen hexafluoroethane ($C_2F_6$), trifluoromethane ($CHF_3$), difluoromethane ($CH_2F_2$), octofluoropropane ($C_3F_8$), octofluorocyclobutane ($C_4F_8$), Octafluorocyclopentene ($C_5F_8$), or combinations thereof. In one embodiment, a carrier gas, such as argon, may be included in the etch gas to generate to the ion beams 254a, 254b.

Figure 2H:
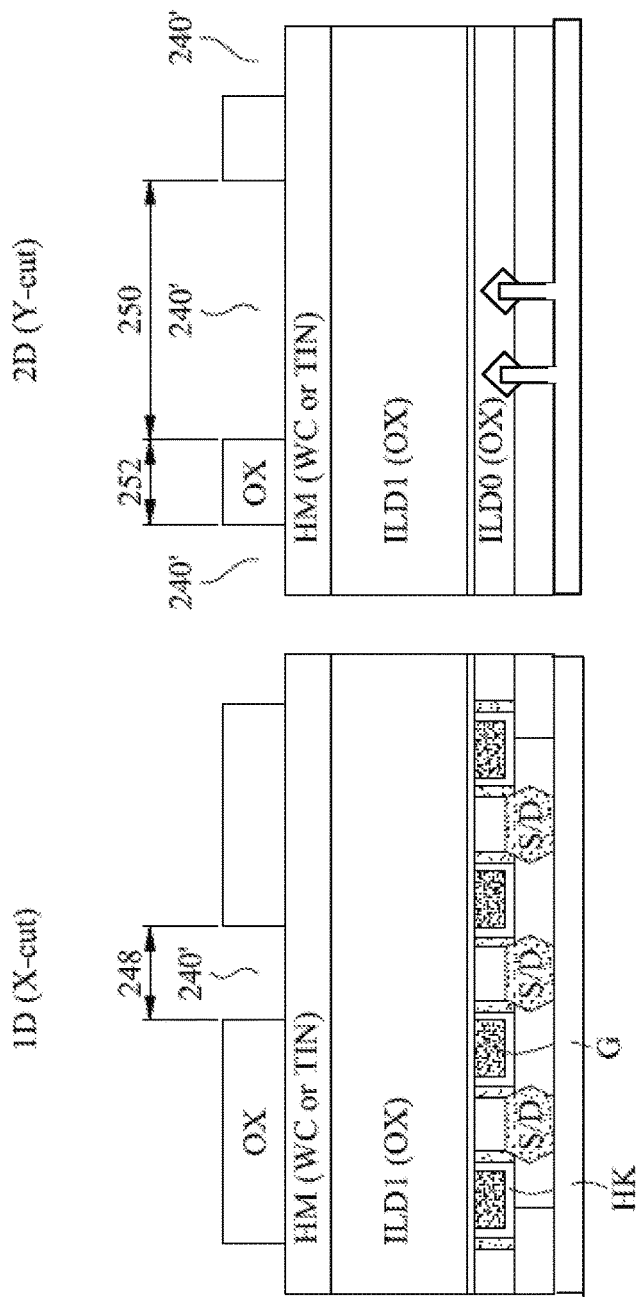

At operation 155 of the method 100, the bottom layer 234 of the tri-layer photoresist structure 232 is removed as shown in FIG. 2H. The bottom layer 234 may be removed by a strip process, such as an ashing process. A wet cleaning process may be performed following the strip process.

The features 240 have been modified to features 240'. The features 240' has a length 250 that is increased by the angled etch process in the operation 145, and a width 248 that is substantially the same as the width 242 of the features 240. An end-to-end distance 252 between the features 240' is reduced from the end-to-end distance 246 between the features 240. The dimension of the features 240' and the end-to-end distance 252 correspond to target dimensions to be formed in the interlayer dielectric layer 226.

Figure 3B:
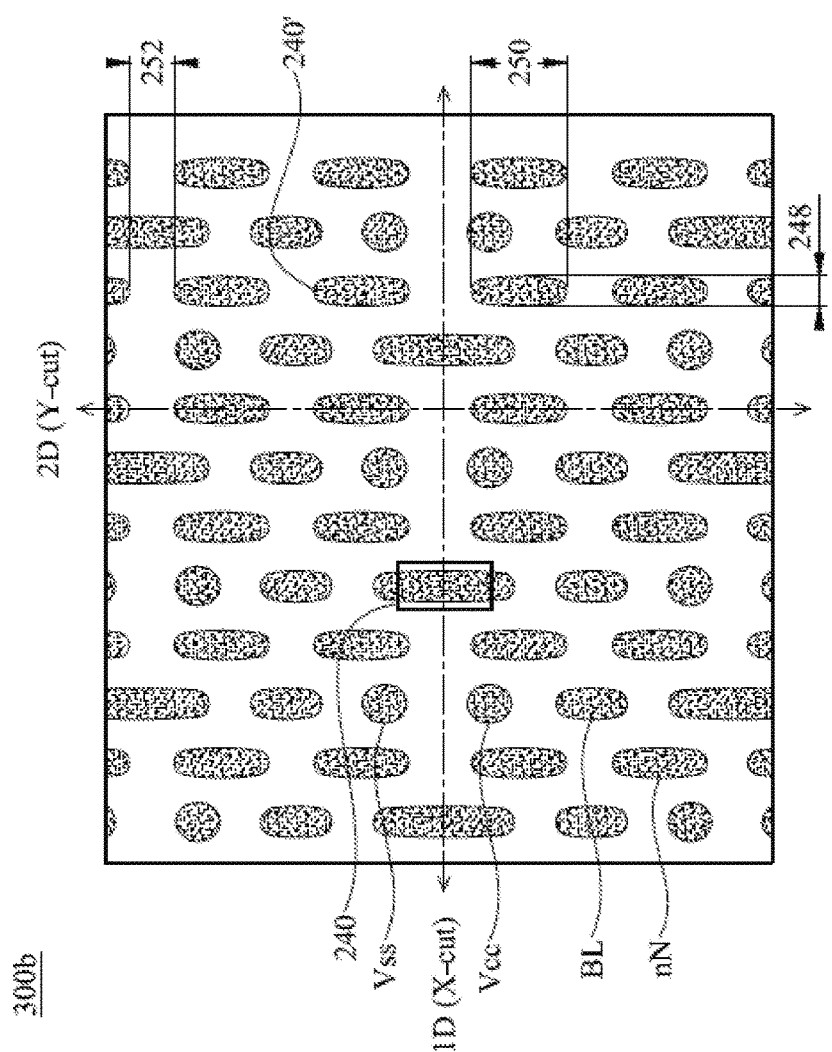
FIG. 3B is a schematic plan view of unidirectional features after an angled etch process according to one embodiment of the present disclosure.

FIG. 3B is a schematic plan view of a pattern 300b formed in the second hard mask layer 230 after the angled etch process according to one embodiment of the present disclosure. The pattern 300b reflects a target pattern to be formed in the interlayer dielectric layer 226. The pattern 300b includes the plurality of unidirectional features 240' modified from the plurality of unidirectional features 240 in the pattern 300a. Particularly, the plurality of features 240' are arranged in multiple lines along the y-direction and have substantially the same widths 248 along the x-direction. The lengths 250 of the plurality of features 240' along the y-direction are similar or different depending on the design of the integrated circuit.

The width 248 of the features 240' may be between about 10 nm and 15 nm. According to embodiments of the present disclosure, the difference between the width 248 and the width 242 is less than 3 nm, for example, nearly 0 nm. In one embodiment, the length 250 of the features 240' may be between about 35 nm to 130 nm. In one embodiment, the end-to-end distance 252 between the neighboring features 240' may be less than about 35 nm. For example, the end-to-end distance 252 may be less than 25 nm. In one embodiment, the end-to-end distance 252 is between about 20 nm and about 25 nm.

In the exemplary pattern of FIG. 3B, the features 240'Vss, 240'Vcc, 240'BL may have a length of about 110 nm, 65 nm, and 45 nm respectively. End-to-end distance between neighboring features 240'Vss, 240'Vcc, 240'BL may be about 20 nm to 30 nm. The features 240'nN may have a length of about 85 nm. End-to-end space between neighboring features 240'nN may be about 20 nm to 30 nm. Comparing the patterns 300a and 300b, the end-to-end distance between the features has been reduced for about 20 nm to 30 nm. In the pattern 300b, the end-to-end distance 252 is less than 35 nm.

Figure 2I:
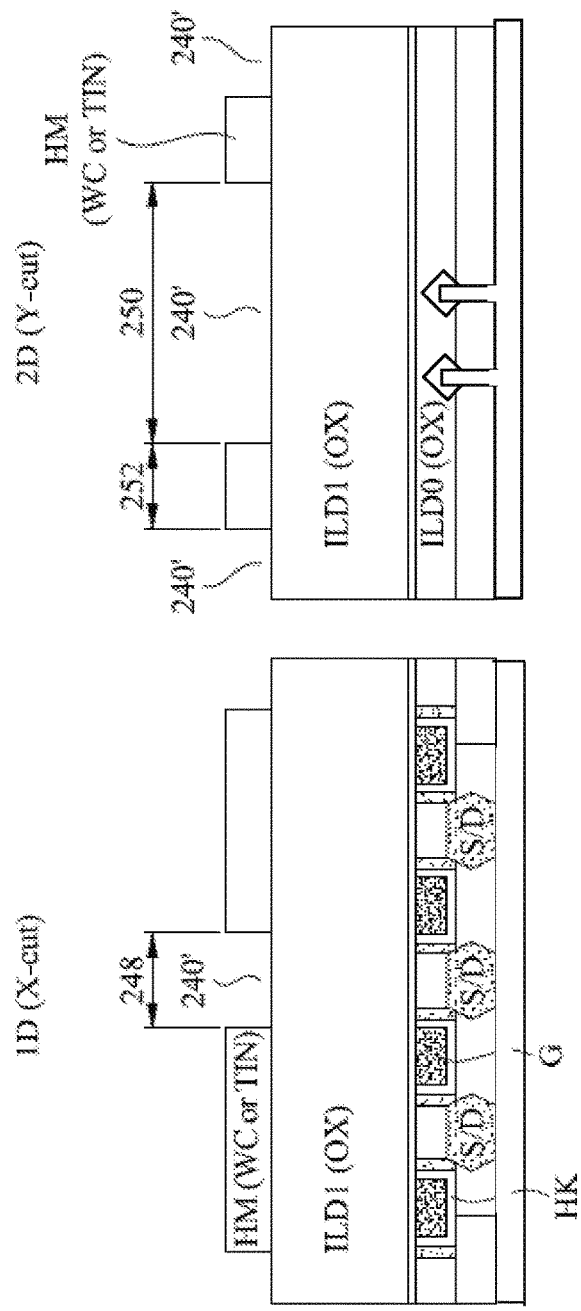

In operation 160 of the method 100, an etch process is performed to transfer the pattern 300b from the second hard mask layer 230 to the first hard mask layer 228 as shown in FIG. 2I. Operation 160 may be performed by a dry etch process using a plasma of an etch gas. In one embodiment, the etch gas includes chlorine or fluorine based gas when the first hard mask layer 228 includes metals, such as titanium nitride, tungsten carbide. For example, the etch gas may include Sulfur hexafluoride ($SF_6$), nitrogen tri-fluoride ($NF_3$) combined with chlorine ($Cl_2$), carbon tetrafluoride ($CF_4$), hexafluoroethane ($C_2F_6$), chlorine ($Cl_2$), Boron trichloride ($BCl_3$), and a combination thereof.

In one embodiment, operation 160 includes a wet cleaning process following the dry etch to remove residues from the substrate. After operation 160, the pattern 300b is transferred to the first hard mask layer 228.

As discussed above, a below 35 nm end-to-end distance may be achieved using three photolithographic processes with three different patterns and four etch processes. The method 100 achieves a below 35 nm end-to-end distance with one photolithographic process, operation 130, and three etch processes, operations 135, 145, 160. As a result, the method 100 reduces production time and cost by eliminating two photolithographic processes and one etch process.

Figure 2J:
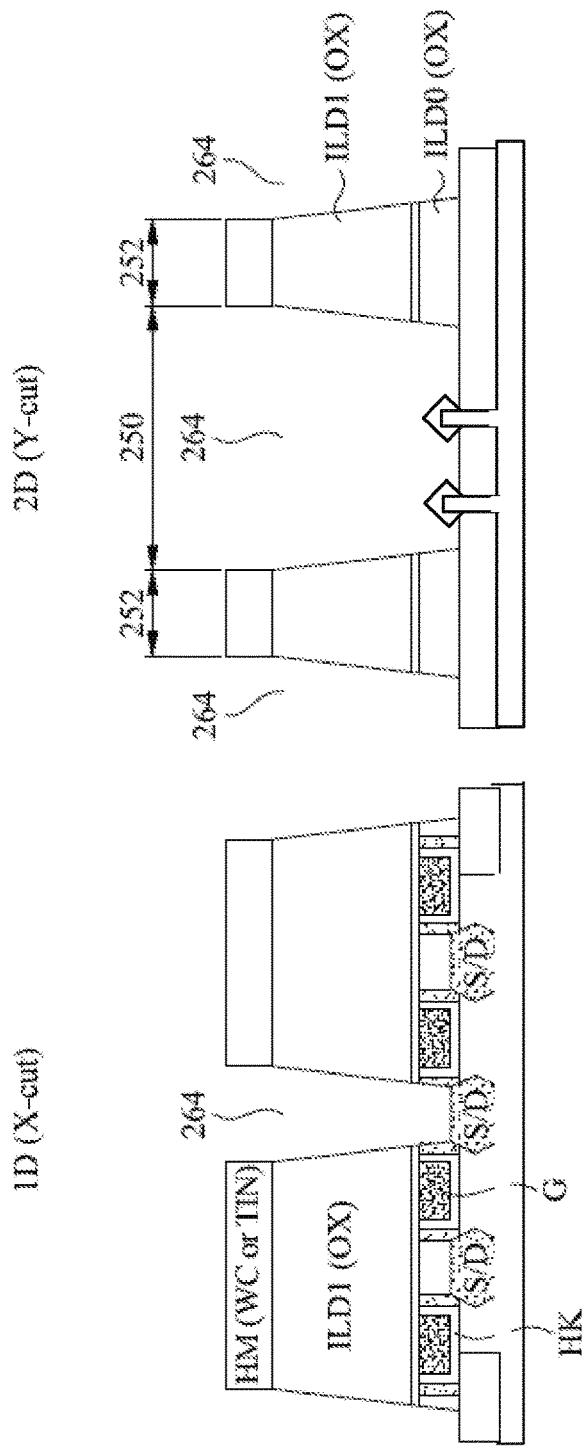

In operation 165 of the method 100, the interlayer dielectric layer 226 is patterned by an etch process using the first hard mask layer 228 as a mask as shown in FIG. 2J. The etch process may be a dry etch process using a plasma of an etch gas. The etch gas may include fluorine-containing gas, nitrogen ($N_2$), oxygen ($O_2$) or combinations thereof. The fluorine-containing gas includes tetrafluoromethane ($CF_4$), nitrogen hexafluoroethane ($C_2F_6$), trifluoromethane ($CHF_3$), difluoromethane ($CH_2F_2$), octofluoropropane ($C_3F_8$), octofluorocyclobutane ($C_4F_8$), Octafluorocyclopentene ($C_5F_8$), or combinations thereof.

In one embodiment, the etch process in operation 165 also etches through the etch stop layer 224 and the interlayer dielectric layer 212 to form features 264. The features 264 may be trenches or vias opening to the source/drain regions, gate electrodes, or other regions of the FinFET device structure 204 for forming electrical contacts to the FinFET device structure 204.

Figure 2K:
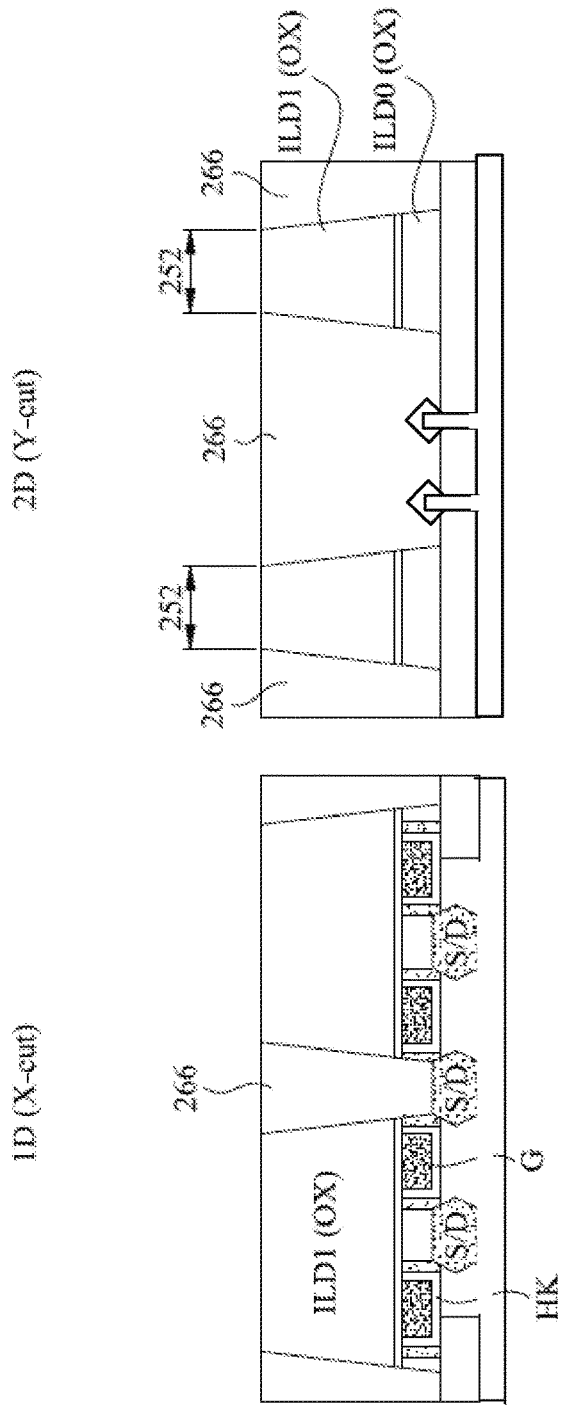

In operation 170 of the method 100, a metallization process is performed to fill the features 264 with electrically conductive material to make contacts 266, as shown in FIG. 2K. In one embodiment, a planization process, such as a chemical mechanical polishing (CMP) process is performed after the metal fill.

In some embodiments, the conductive material used to make contact 266 includes aluminum (Al), copper (Cu), tungsten (W), titanium (Ti), tantulum (Ta), titanium nitride (TiN), tantanium nitride (TaN), nickel silicide (NiSi) cobalt silicide (CoSi), tantulum carbide (TaC), tantulum silicide nitride (TaSiN), tantulum carbide nitride (TaCN), titanium aluminide (TiAl), titanium aluminide nitride (TiAlN), other applicable conductive materials, or a combination thereof. In some embodiments, the contacts 266 include a titanium nitride layer and tungsten formed over the titanium nitride layer.

In some embodiments, the contacts 266 may further include a liner and/or a barrier layer. For example, a liner (not shown) may be formed on the sidewalls and bottom of the contact trench 264. The liner may be either tetraethyl-orthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As shown in FIG. 2K, the contacts 266 are formed through the interlayer dielectric layer 226. The end-to-end distance between the metal contacts 266 is less than 35 nm. In one embodiment, the end-to-end distance between the metal contacts 266 is between about 20 nm and about 25 nm.

The angled etch process according to the present disclosure, as discussed in operation 145 of the method 100, may be performed in a plasma chamber where ion beams can be directed to a substrate being processed at an angle.

Figure 5:
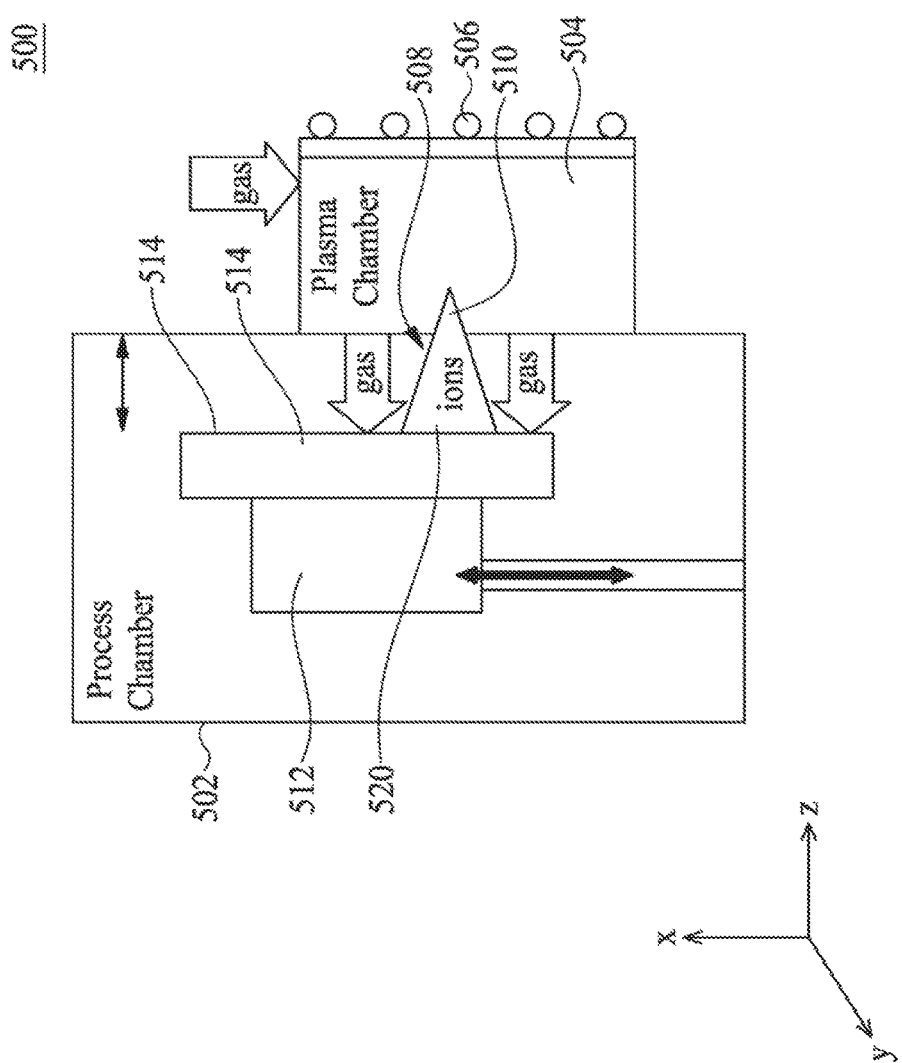
FIG. 5 is a schematic sectional view of a process apparatus for performing the angled etch according to embodiment of the present disclosure.

FIG. 5 is a schematic sectional view of a process apparatus 500 for performing the angled etch according to embodiment of the present disclosure. The process apparatus 500 generates and directs an ion beam ribbon towards a substrate at an angle.

As shown in FIG. 5, the process apparatus 500 may include a process chamber 502 and a plasma chamber 504. The process apparatus 500 may include an antenna 506. The antenna 506 may be disposed outside the plasma chamber 504. The antenna 506 may be electrically connected to a RF power supply (not shown), which supplies an alternating voltage to the antenna 506. The voltage may be at a frequency of, for example, 2 MHz or more, to generate a plasma in the plasma chamber 504. In operation, the antenna 506 is powered using a RF signal to inductively couple energy into the plasma chamber 504. The inductively coupled energy excites a process gas, such as the etch gas in operation 145, introduced the plasma chamber, thus generating a plasma.

The plasma chamber 504 includes a chamber wall 508 having an extraction aperture 510. The chamber wall 508 may be disposed on the side of the process chamber 502 facing a substrate carrier 512 disposed in the process chamber 502. The extract aperture 510 is configured to direct a ribbon of ion beams 520 towards the substrate carrier 512. As shown in circle 518, the aperture 510 may be configured to direct the ribbon of ion beam 520 at various angels and combinations towards the substrate 514.

The substrate carrier 512 is configured to secure and move a substrate 514 in the process chamber 502. The substrate carrier 512 may translate the along the x direction in the process chamber 502 so that the ribbon of ion beam 520 scan through the entire surface of the substrate 514 on the substrate carrier 512.

The substrate 514 may be grounded during operation. An extraction power supply 516 may be used to apply an extraction voltage between the substrate 514 and the chamber wall 508. The extraction voltage may be between about 800 Volt and about 1200 volt, for example, about 1000 volt, although other voltages are within the scope of the disclosure. In addition, the extraction voltage may be a square wave, having a frequency of between about 1 kHz and 50 kHz, although other frequencies are within the scope of the disclosure.

When the extraction voltage is applied between the chamber wall 508 of the plasma chamber 504 and the substrate 514, and the plasma within the plasma chamber 504 is biased by the extraction voltage relative to the substrate 514. The difference in potential between the plasma and the substrate 514 causes positively charged ions in the plasma to be accelerated through the extraction aperture 510 in the form of the ribbon of ion beam 520 and toward the substrate 514.

During operation, the substrate 514 is disposed proximate and opposite the chamber wall 508 having the extraction aperture 510. In some embodiments, the substrate 514 may be positioned between about 5 mm and 15 mm away from the aperture 510, for example, about 12 mm.

In one embodiment, the substrate 514 may be positioned relative to the extraction aperture 510 to align features on the substrate 514 to the ribbon of ion beams 520 to achieve the angled etch according to the present disclosure. In one embodiment, the substrate 514 may be pre-aligned before secured to the substrate carrier 512. In one embodiment, the substrate 514 may be rotated about the z-axis by the substrate carrier 512. In other embodiment, the extraction aperture 510 may be rotated about the z-axis. In other embodiment, both the substrate carrier 512 and the extraction aperture 510 may rotate about the z-axis.

The ribbon of ion beam 520 may be at least as wide as the substrate 514 in one direction, such as the y-direction, and may be much narrower than the substrate 514 in the orthogonal direction (or x-direction). The substrate 514 may be translated relative to the extraction aperture 510 such that different portions of the substrate 514 are exposed to the ribbon of ion beam 520. In another embodiment, the plasma chamber 504 may be translated while the substrate 514 remains stationary. In other embodiments, both the plasma chamber 504 and the substrate 514 may be translated. In some embodiments, the substrate 514 moves at a constant workpiece scan velocity relative to the extraction aperture 510 in the x-direction, so that the entirety of the substrate 514 is exposed to the ribbon of ion beam 520 for the same amount of time.

Figure 6:
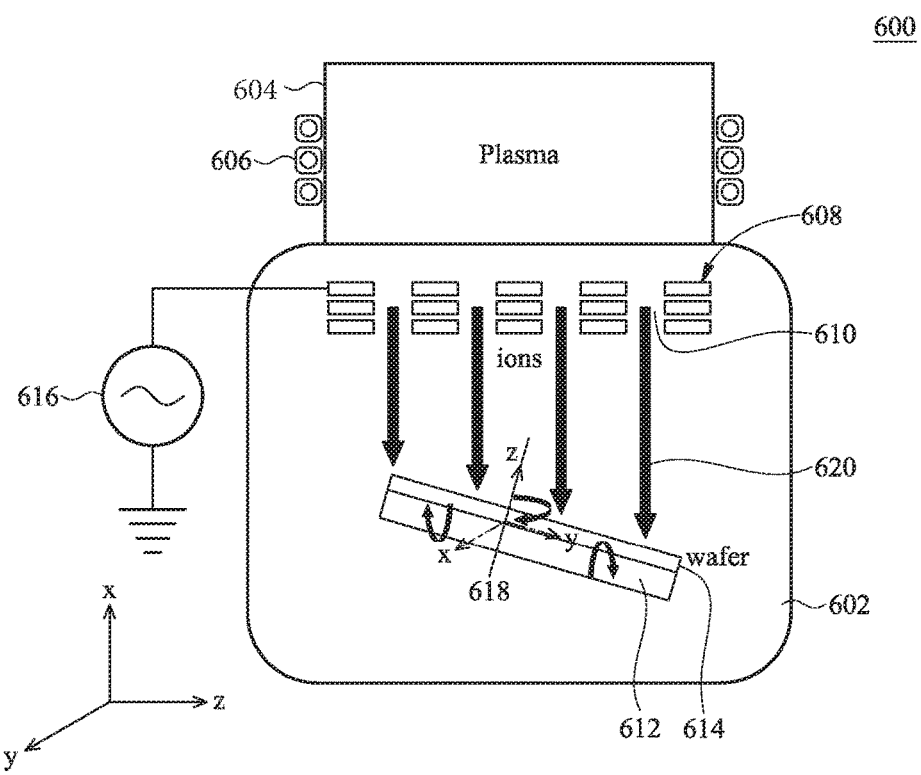
FIG. 6 is a schematic sectional view of a process apparatus for performing the angled etch according to embodiment of the present disclosure.

FIG. 6 is a schematic sectional view of a process apparatus 600 for performing the angled etch according to embodiment of the present disclosure. The process apparatus 600 generates and directs a bulk ion beam 620 towards a substrate at an angle.

As shown in FIG. 6, the process apparatus 600 may include a process chamber 602 and a plasma chamber 604. The process apparatus 600 may include an antenna 606. The antenna 606 may be disposed outside the plasma chamber 604. The antenna 606 may be electrically connected to a RF power supply (not shown), which supplies an alternating voltage to the antenna 606. The voltage may be at a frequency of, for example, 2 MHz or more, to generate a plasma in the plasma chamber 604. In operation, the antenna 606 is powered using a RF signal to inductively couple energy into the plasma chamber 604. The inductively coupled energy excites a process gas, such as the etch gas in operation 145, which is introduced into the plasma chamber 604, thus generating a plasma.

The plasma chamber 604 includes a plasm grill 608 having a plurality of apertures 610. The plasm grill 608 may be disposed over the process chamber 602 facing a substrate carrier 612 disposed in the process chamber 602. The plurality of apertures 610 are configured to direct the bulk ion beam 620 along the z-direction. The bulk ion beam 620 may be directed towards the substrate 614 on the substrate carrier 612 at various impinging angles. The impinging angle of the bulk ion beam 620 is controlled by rotating the substrate carrier about the x-direction.

The substrate carrier 612 is configured to secure and move a substrate 614 in the process chamber 602. The substrate carrier 612 may translate the along the z direction in the process chamber 602 to adjust the distance between the substrate 614 and the plasma grill 608. The substrate carrier 612 may also rotate about the x-axis, y-axis, and z-axis to align the substrate 614 with the bulk ion beam 620 and to adjust the impinging angle of the bulk ion beam 620 at the substrate 614. As shown in FIG. 6, the x-y-z coordinate system is selected where the z-axis passes through a center axis 618 of the substrate carrier 612.

The substrate 614 may be grounded during operation. An extraction power supply 616 may be used to apply an extraction voltage between the substrate 614 and the plasma grill 608. The extraction voltage may be a constant voltage. Alternatively, the extraction voltage may be a square wave, having a frequency of between about 1 kHz and 50 kHz, although other frequencies are within the scope of the disclosure.

When the extraction voltage is applied between the plasma grill 608 and the substrate 614, and the plasma within the plasma chamber 604 is biased by the extraction voltage relative to the substrate 614. The difference in potential between the plasma and the substrate 614 causes positively charged ions in the plasma to be accelerated through the plurality of apertures 610 in the plasma grill 608 the bulk ion beam 620 toward the substrate 614.

Prior to performing an angled etch process according to the present disclosure, the substrate 614 may be secured to the substrate carrier 612. The substrate carrier 612 may rotate about the z-axis to align longitudinal axis of features on the substrate 614, such as the features 240. For example, the substrate 614 may be rotated so that the lengths 244 of the features 240 are parallel to the y-axis. The substrate 614 may be rotated about the x-axis by the substrate carrier 612 to select an angle for the angled etch as disclosed in the present disclosure.

During the angled etch as described in operation 145, the substrate remains stationary. In one embodiment, the substrate 614 may be rotated for 180 degrees about the z-axis at half time to balance the distance differences between the plasma grill 608 and different portions of the substrate 614.

EXAMPLE

In one example, the method 100 of the present disclosure is performed using a process apparatus similar to the process apparatus 500 of FIG. 5 to perform the angled etch in operation 145 of the method 100.

Prior to operation 145, a first pattern is formed in a tri-layer photoresist layer. After a photolithographic process, the pattern includes a Vss feature, a Vcc feature, and a BL feature arranged repeatedly and sequentially lengthwise in a line. The Vss feature has a length of about 100 nm, the Vcc feature has a length of about 55 nm, and the BL feature has a length of about 35 nm. The end-to-end distance between the BL feature and the Vss feature is about 30 nm. The end-to-end distance between the Vss feature and the Vcc feature is about 30 nm. The end-to-end distance between the Vcc feature and the BL feature is about 30 nm. After etching a second hard mask, such as the hard mark 230, the pattern includes a Vss feature, a Vcc feature, and a BL feature arranged repeatedly and sequentially lengthwise in a line. The Vss feature has a length of about 80 nm, the Vcc feature has a length of about 35 nm, and the BL feature has a length of about 15 nm. The end-to-end distance between the BL feature and the Vss feature is about 50 nm. The end-to-end distance between the Vss feature and the Vcc feature is about 50 nm. The end-to-end distance between the Vcc feature and the BL feature is about 50 nm An angled etch process is performed to the first pattern using a process apparatus similar to the process apparatus 500. During operation, a 1000 Watt power is applied to the plasma source to generate a plasma of an etch gas. A 1000 volt extraction voltage is applied to extract a ribbon of ion beam. The etch gas includes 10 sccm of $CF_4$, 5 sccm of $CH_3F$ and 9 sccm of Argon. The impinging angle of the ribbon of ion beam is about 21 degrees. The distance between the substrate and the extraction aperture is about 12 mm. The angled process is performed for 10-30 minutes.

After the angled etch process, the Vss feature has a length of about 110 nm, increased by 30 nm from the original length 80 nm. The Vcc feature has a length of about 65 nm, increased by 30 nm from the original length 35 nm. The BL feature has a length of about 45 nm, increased by 30 nm from the original length 15 nm. The variation in length change between long openings and short openings are less than 2 nm. The changes in width of the features are not detectable or less than 3 nm. The end-to-end distance between the BL feature and the Vss feature is about 25 nm. The end-to-end distance between the Vss feature and the Vcc feature is about 25 nm. The end-to-end distance between the Vcc feature and the BL feature is about 25 nm.

Even though a process for patterning an interlayer metal dielectric layer is described above, embodiments of the present disclosure may be used for patterning layers to form unidirectional features with an end-to-end distance lower than 35 nm. For example, embodiments of the present disclosure may be used to pattern an active region with line features, for example to form fin in the active region, pattern a polysilicon layer, for example to form dummy gates in the polysilicon layer, or pattern a metal gate structure, for example to form isolation structures in metal gates.

Even though a method for manufacturing FinFET devices is described above, embodiments of the present disclosure may be used in manufacturing of any suitable devices where there is a need to form a pattern with an end-to-end distance lower than 35 nm. For example, device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements.

Embodiments of the present disclosure may be used for patterning a layer in a 5 nm node or beyond 5 nm node fabrication to achieve an end-to-end distance below 35 nm. Compared to the state of the art technology, embodiments of the present disclosure reduce cycle time and cost of production from three lithographic processes and four etching processes to one lithographic process and three etch processes.

One embodiment of the present disclosure provides a method of processing a substrate. The method includes patterning a hard mask layer on the substrate to form a feature in the hard mask layer, and performing an angled etch process to modify the feature by increasing a length of the feature while maintaining a width of the feature. In some embodiments, performing the angled etch process includes directing an ion beam towards a top surface of the substrate, wherein a plane including the ion beam is parallel to a plane of a sidewall of the feature along the length of the feature. In some embodiments, the ion beam is at an impinging angle relative to a z-axis perpendicular to the top surface of the substrate. In some embodiments, the impinging angle is between about 10 degrees to about 30 degrees. In some embodiments, the method further includes selecting the impinging angle according to an aspect ratio of the feature. In some embodiments, the ion beam is a ribbon of ion beam covering a width of the substrate. In some embodiments, the ion beam is a bulk ion beam covering the entire top surface of the substrate. In some embodiments, the length of the feature is increased by about 20 nm to about 30 nm. In some embodiments, patterning the mask layer is performed by an extreme ultraviolet (EUV) lithographic process. In some embodiments, the method further includes removing a photoresist layer used in patterning the mask layer after performing the angled etch process.

Another embodiment of the present disclosure provides a method of patterning a layer on a substrate. The method includes forming a first hard mask layer over the layer, forming a second mask layer over the first mask layer, forming a photoresist layer over the second mask layer, patterning the photoresist layer using a photolithographic process, etching the second mask layer using the photoresist layer as a mask to form a feature in the second mask layer, performing an angled etch to modify the feature by increasing a length of the feature without changing a width of the feature, and etching the first mask layer using the second mask layer as a mask. In some embodiments, the photolithographic process is an extreme ultraviolet (EUV) lithographic process. In some embodiments, performing the angled etch process includes directing an ion beam towards a top surface of the substrate, wherein a plane including the ion beam is parallel to a plane of a sidewall of the feature along the length of the feature. In some embodiments, the ion beam is at an impinging angle relative to a z-axis perpendicular to the top surface of the substrate. In some embodiments, the impinging angle is between about 10 degrees to about 30 degrees. In some embodiments, the ion beam is a ribbon of ion beam covering a width of the substrate. In some embodiments, the ion beam is a bulk ion beam covering the entire top surface of the substrate. In some embodiments, wherein the length of the feature is increased by about 20 nm to about 30 nm. In some embodiments, the layer is one of an interlayer dielectric layer formed over FinFET device structures.

Another embodiment of the present disclosure provides a method of manufacturing a semiconductor device. The method includes patterning a hard mask layer on a substrate to form a first pattern in the hard mask layer, wherein the first pattern includes two or more unidirectional features aligned along a line having an end-to-end distance at a first value, and performing an angled etch process to reduce the end-to-end distance between two features from the first value to a second value without changing a width of the two or more features. In some embodiments, the second value of the end-to-end distance is less than 35 nm. In some embodiments, performing the angled etch process includes directing an ion beam towards a top surface of the substrate, wherein a plane including the ion beam is parallel to a plane of a sidewall of the feature along the length of the feature. In some embodiments, the ion beam is at an impinging angle relative to a z-axis perpendicular to the top surface of the substrate. In some embodiments, the ion beam is a bulk ion beam covering the entire top surface of the substrate. In some embodiments, the length of the feature is increased by about 20 nm to about 30 nm.

Another embodiment of the present disclosure provides a method for forming a semiconductor device. The method includes forming an interlayer dielectric layer over gate structures of a FinFET structure, and patterning the interlayer dielectric layer to form a contact opening in the interlayer dielectric layer, including forming a first hard mask layer over the interlayer dielectric layer, forming a second hard mask layer over the first hard mask layer, patterning the second hard mask layer to form a first opening in the first hard mask layer, wherein a length of the first opening is shorter than a length of the contact opening, performing an angled etch process to increase the length of first opening without changing a width of the first opening, etching the first hard mask layer using the second hard mask as a mask, thereby, transferring the modified first opening to the first hard mask layer, and etching the interlayer dielectric layer to form the contact opening using the modified first opening in the first hard mask as a mask. In some embodiments, performing the angled etch process includes directing an ion beam towards a top surface of the substrate, wherein a plane including the ion beam is parallel to a plane of a sidewall of the first opening along the length of the first opening.

Another embodiment of the present disclosure provides a method of forming a semiconductor device. The method includes forming an interlayer dielectric layer over gate structures of a FinFET structure, and patterning the interlayer dielectric layer to form a contact opening in the interlayer dielectric layer, including patterning a hard mask layer over the interlayer dielectric layer to form a first pattern in the hard mask layer, wherein the first pattern includes two or more unidirectional features aligned along a line having an end-to-end distance at a first value, and performing an angled etch process to increase a length of the two or more features without changing a width of the two or more features, thereby, reducing the end-to-end distance from the first value to a second value.

Another embodiment of the present disclosure provides a method for manufacturing a semiconductor device. The method includes forming a first pattern in a photoresist layer, wherein the first pattern includes unidirectional features, etching a mask layer below the photoresist layer using the photoresist layer as a mask to form the first pattern in the mask layer, and directing an ion beam at an angle to increase lengths of the unidirectional features without enlarging a width of the unidirectional features. In some embodiments, the ion beam is directed along a plane parallel to a plane of sidewalls of the unidirectional features along the length of the unidirectional features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a layer on a substrate, comprising:
    forming a first mask layer over the layer;
    forming a second mask layer over the first mask layer;
    forming a photoresist layer over the second mask layer;
    patterning the photoresist layer using a photolithographic process;
    etching the second mask layer using the photoresist layer as a mask to form a feature in the second mask layer;
    performing an angled etch to modify the feature by increasing a length of the feature without changing a width of the feature; and
    etching the first mask layer using the second mask layer as a mask.

2. The method of claim 1, wherein the photolithographic process is an extreme ultraviolet (EUV) lithographic process.

3. The method of claim 1, wherein performing the angled etch comprising:
    directing an ion beam towards a top surface of the substrate, wherein a plane including the ion beam is parallel to a plane of a sidewall of the feature along the length of the feature.

4. The method of claim 3, wherein the ion beam is at an impinging angle relative to a z-axis perpendicular to the top surface of the substrate.

5. The method of claim 4, wherein the impinging angle is between about 10 degrees to about 30 degrees.

6. The method of claim 3, wherein the ion beam is a ribbon of ion beam covering a width of the substrate.

7. The method of claim 3, wherein the ion beam is a bulk ion beam covering the entire top surface of the substrate.

8. The method of claim 1, wherein the length of the feature is increased by about 20 nm to about 30 nm.

9. The method of claim 1, wherein the layer is one of an interlayer dielectric layer formed over FinFET device structures.

10. A method of forming a semiconductor device, comprising:
    forming an interlayer dielectric layer over gate structures of a FinFET structure; and
    patterning the interlayer dielectric layer to form a contact opening in the interlayer dielectric layer, comprising:
        patterning a hard mask layer over the interlayer dielectric layer to form a first pattern in the hard mask layer, wherein the first pattern includes two or more unidirectional features aligned along a line having an end-to-end distance at a first value; and
        performing an angled etch process to increase a length of the two or more unidirectional features without changing a width of the two or more unidirectional features, thereby, reducing the end-to-end distance from the first value to a second value.

11. The method of claim 10, wherein performing the angled etch process comprises:
    directing an ion beam towards a top surface of the interlayer dielectric layer, wherein a plane including the ion beam is parallel to a plane of a sidewall of the two or more unidirectional features along the length of the two or more unidirectional features.

12. The method of claim 11, wherein the ion beam at an impinging angle relative to a z-axis perpendicular to the top surface of the interlayer dielectric layer.

13. The method of claim 12, wherein the impinging angle is between about 10 degrees to about 30 degrees.

14. The method of claim 12, further comprising selecting the impinging angle according to an aspect ratio of the two or more unidirectional features.

15. The method of claim 10, wherein the length of the two or more unidirectional features is increased by about 20 nm to about 30 nm.

16. The method of claim 10, wherein patterning the hard mask layer is performed by an extreme ultraviolet (EUV) lithographic process.

17. The method of claim 10, further comprising:
    removing a photoresist layer used in patterning the hard mask layer after performing the angled etch process.

18. A method for manufacturing a semiconductor device, comprising:
    forming a first pattern in a photoresist layer, wherein the first pattern includes unidirectional features;
    etching a mask layer below the photoresist layer using the photoresist layer as a mask to the first pattern in the mask layer; and
    directing an ion beam at an angle to increase lengths of the unidirectional features without enlarging a width of the unidirectional features.

19. The method of 18, wherein the ion beam is directed along a plane parallel to a plane of sidewalls of the unidirectional features along the length of the unidirectional features.

20. The method of claim 18, wherein forming the first pattern in a photoresist layer is performed by an extreme ultraviolet (EUV) lithographic process.

* * * * *